United States Patent
Lee

[11] Patent Number: 6,157,169
[45] Date of Patent: Dec. 5, 2000

[54] MONITORING TECHNIQUE FOR ACCURATELY DETERMINING RESIDUAL CAPACITY OF A BATTERY

[75] Inventor: Chang-Hum Lee, Anyang-shi, Rep. of Korea

[73] Assignee: SamSung Electronics Co., Ltd., Suwon, Rep. of Korea

[21] Appl. No.: 09/219,709

[22] Filed: Dec. 23, 1998

Related U.S. Application Data

[63] Continuation-in-part of application No. 09/069,738, Apr. 30, 1998.

[30] Foreign Application Priority Data

Apr. 30, 1997 [KR] Rep. of Korea ............... 97-16856
Dec. 26, 1997 [KR] Rep. of Korea ............... 97-74203

[51] Int. Cl.[7] ........................................... H02J 7/00
[52] U.S. Cl. ................................. 320/132; 320/130
[58] Field of Search ............................ 320/130, 132, 320/133, 134, 135

[56] References Cited

U.S. PATENT DOCUMENTS

| | | | |
|---|---|---|---|
| 4,870,526 | 9/1989 | Maruta et al. | 307/140 |
| 5,012,176 | 4/1991 | LaForge | 320/152 |
| 5,191,291 | 3/1993 | Taylor | 320/136 |
| 5,341,084 | 8/1994 | Gotoh et al. | 320/DIG. 21 |
| 5,341,503 | 8/1994 | Gladstein et al. | 320/136 |
| 5,394,089 | 2/1995 | Clegg | 320/DIG. 21 |
| 5,412,307 | 5/1995 | Yoshimatsu | 320/136 |
| 5,422,822 | 6/1995 | Toyota et al. | 324/427 |
| 5,444,378 | 8/1995 | Rogers | 320/134 |
| 5,518,835 | 5/1996 | Simmonds | 320/DIG. 21 |
| 5,541,489 | 7/1996 | Dunstan | 320/134 |
| 5,545,969 | 8/1996 | Hasegawa | 320/134 |
| 5,561,362 | 10/1996 | Kawamura et al. | 320/134 |
| 5,563,496 | 10/1996 | McClure | 320/128 |
| 5,592,094 | 1/1997 | Ichikawa | 320/127 |
| 5,600,230 | 2/1997 | Dunstan | 320/DIG. 21 |
| 5,606,243 | 2/1997 | Sakai et al. | 320/152 |
| 5,614,829 | 3/1997 | Song | 320/DIG. 21 |
| 5,617,324 | 4/1997 | Arai | 320/DIG. 21 |
| 5,631,540 | 5/1997 | Nguen | 320/127 |
| 5,635,842 | 6/1997 | Yokoo et al. | 320/DIG. 21 |
| 5,648,717 | 7/1997 | Uskali | 320/134 |
| 5,650,712 | 7/1997 | Kawai et al. | 320/DIG. 21 |
| 5,652,502 | 7/1997 | van Phuoc et al. | 702/63 |
| 5,656,919 | 8/1997 | Proctor et al. | 320/153 |
| 5,659,240 | 8/1997 | King | 320/134 |
| 5,672,973 | 9/1997 | Arai et al. | 324/429 |
| 5,680,027 | 10/1997 | Hiratsuka et al. | 320/106 |
| 5,699,050 | 12/1997 | Kanazawa | 320/152 |
| 5,703,471 | 12/1997 | Bullock et al. | 320/134 |
| 5,710,503 | 1/1998 | Sideris et al. | 320/116 |
| 5,744,963 | 4/1998 | Arai et al. | 320/146 |
| 5,789,923 | 8/1998 | Shimoyama et al. | 320/106 |
| 5,809,449 | 9/1998 | Harper | 702/63 |
| 5,903,131 | 5/1999 | Sekine et al. | 320/106 |
| 5,955,869 | 9/1999 | Rathmann | 320/132 |

*Primary Examiner*—Peter S. Wong
*Assistant Examiner*—Lawrence Luk
*Attorney, Agent, or Firm*—Robert E. Bushnell, Esq.

[57] ABSTRACT

A battery monitoring system determines an accurate residual capacity of a battery in consideration of variation of battery temperature, amount of battery self-discharge, and amount of battery discharge from a host device, such as a portable computer. The monitoring system further determines a predicted remaining operating time of the device. The battery capacity measuring apparatus includes a microcontroller, a battery pack, a battery temperature detection circuit, a battery voltage detection circuit, a load current detection circuit, and a power saving level detector. The microcontroller is coupled to a host device such that it indicates the battery residual capacity along with the remaining operating time of the device via a display. The microcontroller calculates the residual capacity of the battery based on the detected battery voltage and a correction is made to the calculated residual capacity according to the battery temperature signal and the load current signal, the corrected resultant residual capacity being fed to the host device so as to display the residual capacity of the battery. Also, the microcontroller calculates the remaining operating time of the device based on the detected load current and a correction is made thereto according to the set power saving level of the device, the resultant remaining operating time being fed to the host device so as to display the corrected remaining operating time of the device.

20 Claims, 10 Drawing Sheets

MONITORING TECHNIQUE FOR ACCURATELY DETERMINING RESIDUAL CAPACITY OF A BATTERY

CROSS-REFERENCE TO RELATED APPLICATIONS

This application is a continuation-in-part of patent application Ser. No. 09/069,738, filed on Apr. 30, 1998, and entitled "MONITORING TECHNIQUE FOR ACCURATELY DETERMINING RESIDUAL CAPACITY OF BATTERY."

CLAIM OF PRIORITY

This application makes reference to and claims all benefits accruing under 35 U.S.C. §119 from an application for A BATTERY MONITORING SYSTEM CAPABLE OF PRODUCING ACCURATE RESIDUAL CAPACITY OF THE BATTERY earlier filed in the Korean Industrial Property Office on the Apr. 30, 1997 and there duly assigned Serial No. 16856/1997 and from an application for MONITORING TECHNIQUE FOR ACCURATELY DETERMINING RESIDUAL CAPACITY OF A BATTERY earlier filed in the Korean Industrial Properly Office on the Dec. 26, 1997 and there duly assigned Serial No. 74203/1997.

BACKGROUND OF THE INVENTION

1. Field of Invention

The present invention relates to a battery monitoring apparatus, and more particularly to a technique for accurately measuring residual capacity of a battery used in portable electronic devices.

2. Description of Related Art

Portable computers and other electronic devices are often powered by charge storage devices such as a battery. The battery is generally rechargeable and made of alkaline batteries in the form of an enclosure type nickel cadmium (Ni—Cd) battery or nickel metal hydride (Ni—MH) battery. Also, lithium ion (Li—ion) batteries of an organic electrolytic cell have been used in high-end portable electronic devices. The above rechargeable batteries require a charger for charging the batteries. The charger includes an internal charger equipped in the battery powered devices; this charger will begin charging the battery whenever the device is powered by AC power.

Further, the battery powered portable electronic devices often have the capability to monitor charge consumption from the battery so that the user can determine the remaining usage time before a required recharge or battery replacement. One prior battery monitoring system measured charge dissipation by measuring current drawn from the battery. In addition, some electronic devices and some battery monitoring system measured remaining battery capacity by checking the voltage across battery terminals. This monitoring system includes a microcontroller that reads the terminal voltage of a battery and calculates the remaining capacity corresponding to an input voltage level of the battery. The amount of battery capacity is converted into a battery gauge signal, preferably in a digital form, to be supplied with the host device such as a notebook computer. The host device displays the battery level via a display when it is requested by a user.

The operation of the above noted monitoring system is as follows. The microcontroller determines whether a battery gauge display key has been operated. The microcontroller detects the terminal voltage of the battery when the key has been operated. The terminal voltage input is compared to the battery level data stored in a memory, and the output is a battery gauge signal corresponding to the terminal voltage input. The stored battery level data corresponds to designated voltage intervals of a typical battery discharge curve. The voltage intervals are classified into several battery levels over time, and each battery level is designated by specific battery capacity data. The battery gauge signal is supplied with the host device to display the battery capacity data that is being denoted by percentage or bar graph via software.

However, the above noted monitoring system is inaccurate since it determines the remaining battery capacity based on the terminal voltage of the battery. It has been found that the battery residual capacity data is affected by battery temperature and battery self-discharge as well as operating conditions of the battery powered device; and much variation is revealed in the battery residual capacity data despite less variation in actual battery capacity.

Further, the battery gauge displaying scheme is inadequate for a user to get information on the remaining operating time of the battery. Thus, there is a need for a battery monitoring system that can provide the user with a prediction of the battery run time at various levels of power consumption.

Attempts have been made in the art of smart batteries to enable the reporting of accurate information to the host device for power management and charge control specific to the battery's state of charge and chemistry. The smart battery is equipped with specialized hardware that provides present state, and calculated and predicted information to its system host under software control. Details of such a smart battery are described in the Smart Battery Specifications jointly developed by Intel and Duracell, Inc. Those specifications define a system level solution for smart batteries, including the battery, the charger and the software layers.

Although this specification provides an ideal solution for many of issues related to batteries used in portable electronic devices, the smart battery device has a complicated construction and a high cost. Thus, the present invention is intended to provide the user with accurate residual battery capacity information along with an accurate prediction of the remaining operating time without using a smart battery.

The following patents each disclose features in common with the present invention but do not teach or suggest a technique for accurately determining the residual capacity of a dumb battery as in the present invention: U.S. Pat. No. 5,650,712 to Kawai et al., entitled Method For Detecting Remaining Battery Current, Voltage, And Temperature Capacity By Continuously Monitoring, U.S. Pat. No. 5,541,489 to Dunstan, entitled Smart Battery Power Availability Feature Based On Battery-Specific Characteristics, U.S. Pat. No. 5,600,230 to Dunstan, entitled Smart Battery Providing Programmable Remaining Capacity And Run-Time alarms Based On Battery-Specific Characteristics, U.S. Pat. No. 5,648,717 to Uskali, entitled Battery Charge Gauge With Current Integrator And Method For Gauging Battery Charge, U.S. Pat. No. 5,656,919 to Proctor et al., entitled Accurate Battery State-Of-Charge Monitoring And Indicating Apparatus And Method, U.S. Pat. No. 5,563,496 to McClure, entitled Battery Monitoring And Charging Control Unit, U.S. Pat. No. 5,652,502 to van Phuoc et al., entitled Battery Pack Having A Processor Controlled Battery Operating System, U.S. Pat. No. 5,444,378 to Rogers, entitled Battery State Of Charge Monitor, U.S. Pat. No. 5,191,291 to Taylor, entitled Method And Apparatus For Determining The Performance Capabilities Of Secondary Batteries, U.S.

Pat. No. 5,659,240 to King, entitled Intelligent Battery Charger For Electric Drive System Batteries, U.S. Pat. No. 5,680,027 to Hiratsuka et al., entitled Battery Pack Including Internal Capacity Monitor For Monitoring Groups Of Battery Cells, U.S. Pat. No. 5,703,471 to Bullock et al., entitled Battery Protection Circuitry For Limiting Charging Parameters Of A Battery Plant, U.S. Pat. No. 5,606,243 to Sakai et al., entitled Battery State Judging Apparatus, U.S. Pat. No. 5,592,094 to Ichikawa, entitled Battery Discharge Characteristics Calculation Method And Remaining Battery Capacity Measuring Device, U.S. Pat. No. 5,561,362 to Kawamura et al., entitled Remaining Capacity Meter And Detection Method For Electric Vehicle Battery, U.S. Pat. No. 5,631,540 to Nguyen, entitled Method And Apparatus For Predicting The Remaining Capacity And Reserve Time Of A Battery On Discharge, U.S. Pat. No. 5,656,919 to Proctor et al., entitled Accurate Battery State-Of-Charge Monitoring And Indicating Apparatus And Method, U.S. Pat. No. 5,710,503 to Sideris et al., entitled On-Line Battery Monitoring System With Defective Cell Detection Capability, U.S. Pat. No. 5,412,307 to Yoshinatsu, entitled Residual Capacity Indicating Device, U.S. Pat. No. 5,012,176 to LaForge, entitled Apparatus And Method For Calorimetrically Determining Battery Charge State, U.S. Pat. No. 5,545,969 to Hasegawa, entitled Battery Residual Capacity Displaying System With Discharged Electrical Quantity Computation Section, U.S. Pat. No. 5,744,963 to Arai et al., entitled Battery Residual Capacity Measuring Apparatus And Method For Measuring Open-Circuit Voltages As The Battery Starts And Stops Supplying Power, U.S. Pat. No. 5,394,089 to Clegg, entitled Battery Monitor Which Indicates Remaining Capacity By Continuously Monitoring Instantaneous Power Consumption Relative To Expected Hyperbolic Discharge Rates, U.S. Pat. No. 5,422,822 to Toyota et al., entitled Apparatus For Detecting Remanent Stored Energy In Storage Battery And Apparatus For Warning Of Reduction In Remanent Stored Energy In Storage Battery, U.S. Pat. No. 5,518,835 to Simmonds, entitled Device For Indicating The Residual Capacity Of Secondary Cells, U.S. Pat. No. 5,614,829 to Song, entitled State-Of-Charge Measuring Method Using Multilevel Peukert's Equation, U.S. Pat. No. 5,617,324 to Arai, entitled Remaining Battery Capacity measuring Method And Apparatus, U.S. Pat. No. 5,650,712 to Kawai et al., entitled Method For Detecting Remaining Batterv Current, Voltage, And Temperature Capacity By Continuously Monitoring, U.S. Pat. No. 5,341,084 to Gotoh et al., entitled Method And Device For Determining And Indicating A Residual Capacity Of A Battery, U.S. Pat. No. 5,672,973 to Arai et al., entitled Apparatus For Monitoring Battery Residual Capacity In Multiple Modes, U.S. Pat. No. 5,789,923 to Shimoyama et al., entitled Battery Remaining Capacity Measuring Device, U.S. Pat. No. 5,809,449 to Harper, entitled Indicator Of Battery Current For Portable Devices, U.S. Pat. No. 5,699,050 to Kanazawa, entitled Battery Capacity Meter, U.S. Pat. No. 5,635,842 to Yokoo et al., entitled Method Of Estimating Residual Capacity Of Battery, and U.S. Pat. No. 5,680,027 to Hiratsuka et al., entitled Battery Pack Including Internal Capacity Monitor For Monitoring Groups Of Battery Cells.

SUMMARY OF THE INVENTION

It is therefore an object of the invention to provide a battery monitoring system which can accurately determine residual capacity of a dumb battery in consideration of variation of battery temperature, amount of battery self-discharge, and amount of battery discharge from a host device.

It is another object of the present invention to provide a battery monitoring system which can provide the user with accurate information on the remaining battery capacity, as well as the remaining operating time of the host device.

In accordance with the present invention, the battery monitoring system includes: a voltage detector for detecting a terminal voltage of the battery and for producing a terminal voltage signal corresponding to the detected battery voltage; a temperature sensor for sensing the battery temperature and for producing a battery temperature signal corresponding to the sensed battery temperature; a current sensor for sensing a load current of the battery and for producing a load current signal corresponding to the sensed battery load current; a detector for detecting a power saving level set in the portable electronic device and display device; and a calculator for calculating the residual capacity of the battery based on the detected battery voltage and a predicted remaining operating time of the device based on the detected load current, and for correcting the calculated residual capacity according to the battery temperature signal and the load current signal, as well as the predicted remaining operating time according to the set power saving level of the device, the resultant residual capacity and predicted remaining operating time of device being fed to the portable electronic device so as to display the corrected residual capacity of the battery and the remaining operating time of the device.

Further, a method for measuring the residual capacity of a dumb battery used in a host device is provided in accordance with the invention, the method comprising the steps of: detecting a terminal voltage of the battery; calculating a remaining battery capacity from the detected battery voltage; detecting at least one environmental factor causing inaccuracy of the calculated remaining battery capacity; determining whether a correction is required of the calculated remaining battery capacity according to the detected at least one environmental factor; correcting the calculated remaining battery capacity based on the at least one environmental factor; and producing a corrected battery residual capacity for display by the host device.

The at least one environmental factor comprising at least one of: a variation of battery temperature, amount of battery self-discharge, and amount of battery discharge from the host device.

The remaining battery capacity correction step comprising the steps of: subtracting a value corresponding to the variation of the battery temperature from the calculated remaining battery capacity if the battery temperature is higher than a predetermined ambient temperature; adding a value corresponding to the variation of the battery temperature to the calculated remaining battery capacity if the battery temperature is lower than the predetermined ambient temperature.

Further provided is a method for indicating a remaining operating time of a host device when it is powered by a battery, the method comprising: detecting a terminal voltage of the battery; detecting a current value discharged by the battery; calculating an available operating time of the device based on the detected battery terminal voltage and current value; detecting at least one power saving related factor set in the host device; determining whether a correction is required of the calculated remaining operating time according to the detected at least one power saving related factor; correcting the calculated remaining operating time based on the at least one power saving related factor; and producing a corrected remaining operating time for display by the host device.

The at least one power saving related factor comprising: at least one of a variation of the power saving level set in the power management setup of a BIOS ROM and the display power saving level set in the display property of an operating system.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

FIGS. 1 to 4 illustrate the earlier battery monitoring system discussed in the Description of the Related Art above. The battery monitoring system includes a microcontroller 20, a battery 10, a host device 30, and a display 40. Vin is the voltage level that is being detected by the microcontroller 20 from the terminal voltage of the battery 10. The input voltage level is converted into the predefined remaining battery capacity value to produce a battery gauge signal Vs that is being supplied to the host device 30.

Figure 1:
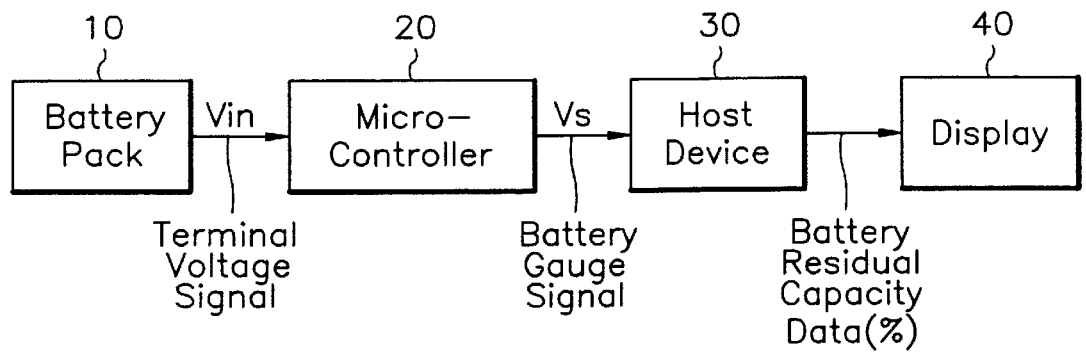
FIG. 1 is a diagram depicting an earlier battery monitoring system that displays residual capacity data of a battery based on voltage level detected from the battery.
Figure 2:
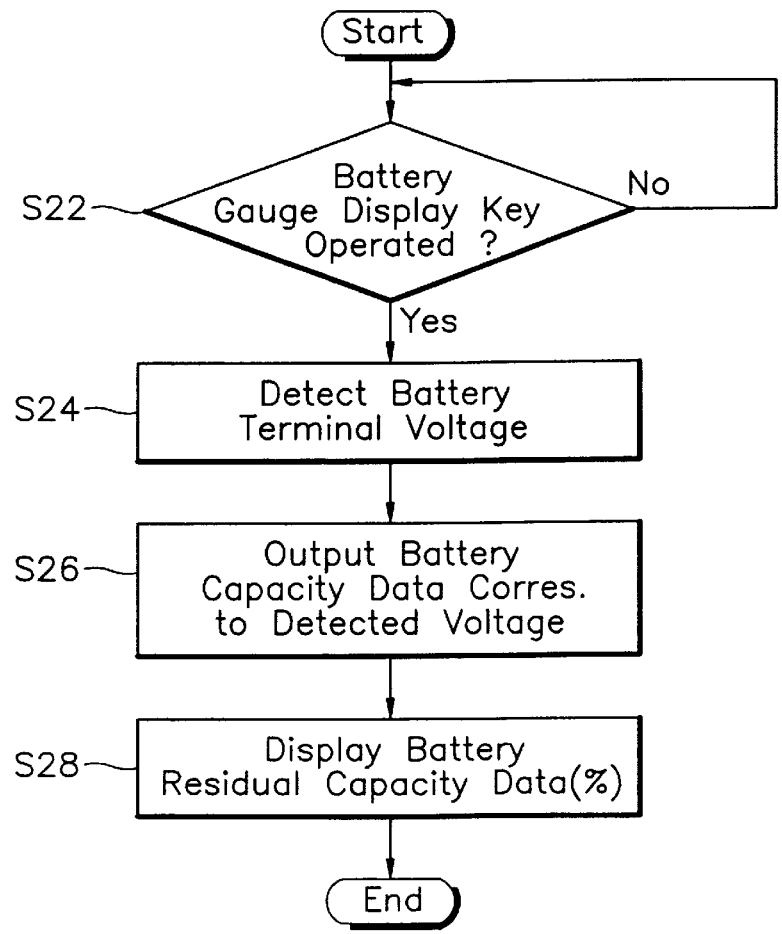
FIG. 2 is a flowchart showing operation of the monitoring system of FIG. 1.

As illustrated in FIG. 2, in step S22, the microcontroller 20 determines whether a battery gauge display key has been operated. The microcontroller 20 detects the terminal voltage of the battery at step S24 and the voltage Vin is compared to the battery level data stored in a memory. The microcontroller 20 outputs battery gauge signal Vs corresponding to the battery level data in step S26 and the battery residual capacity data is displayed on the display 40 of the host device in step S28.

Figure 3:
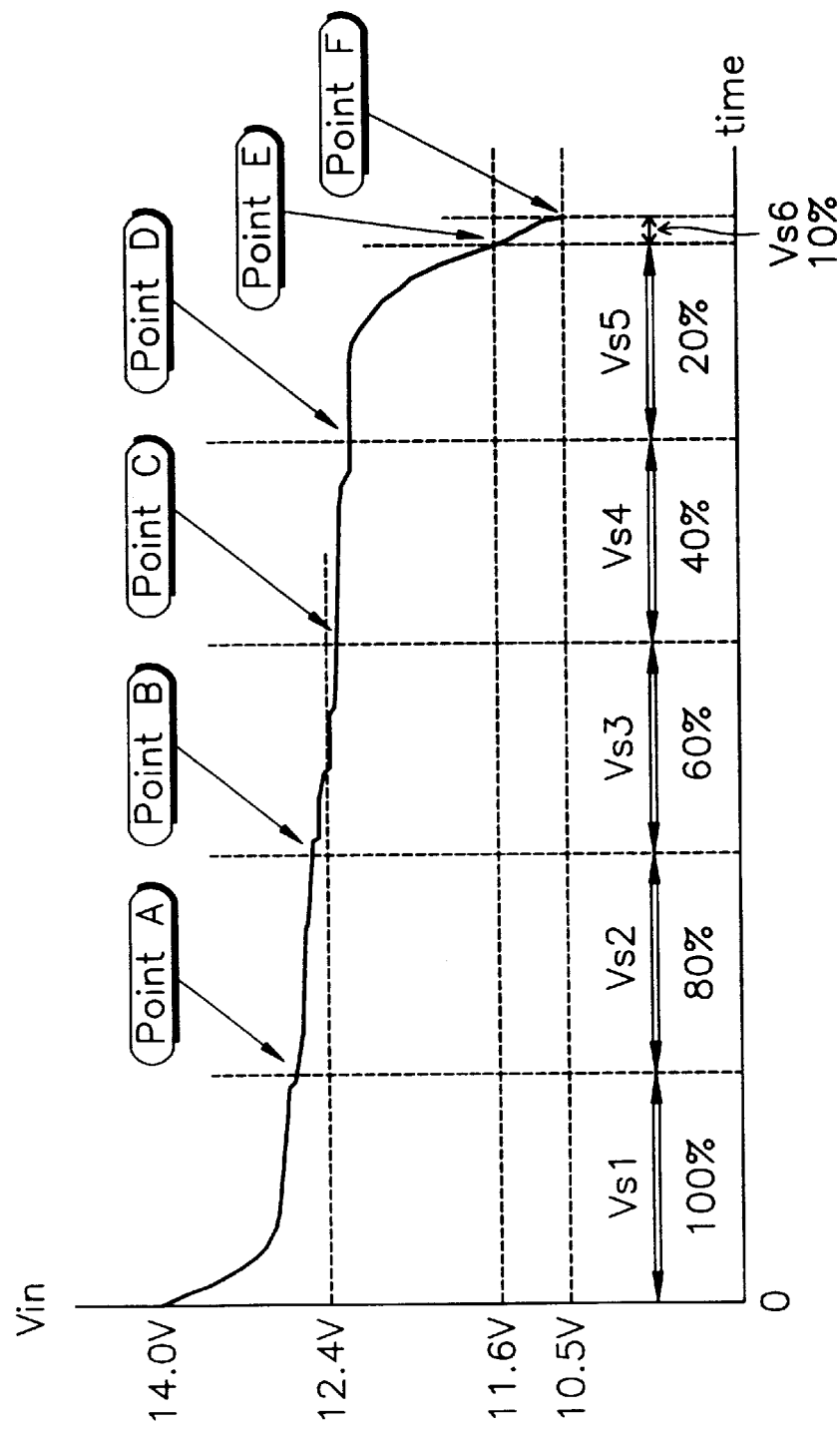
FIG. 3 is a graph showing typical discharge voltage curve of a rechargeable battery.

As shown in FIG. 3, the stored battery level data corresponds to designated voltage intervals Vs1–Vs6 of a typical battery discharge curve. The voltage intervals are classified into six battery levels from zero to F points over time, and each battery level is designated by specific battery capacity data from 100 to 10%. For example, if the detected terminal voltage corresponds to the battery level data which falls to the voltage interval Vs2, between point A and B, the battery capacity data will be represented by 80%, as the residual battery capacity.

Figure 4:
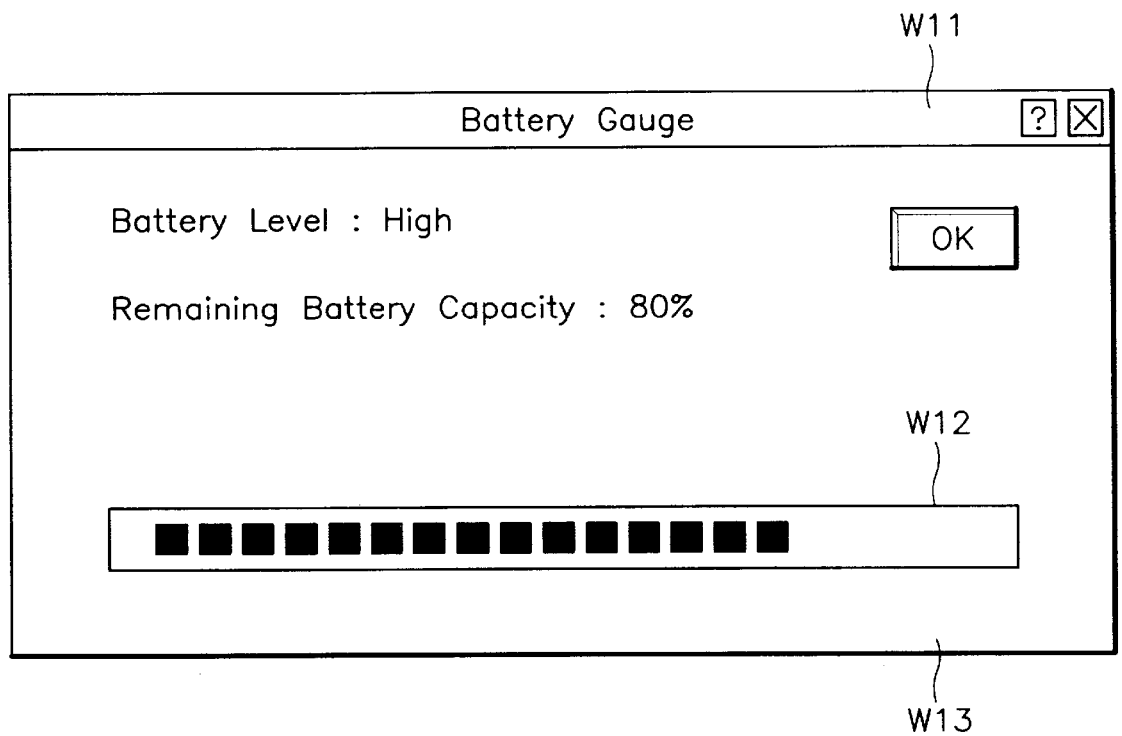
FIG. 4 is a diagram showing a battery gauge displayed on the monitor screen of a portable computer.

FIG. 4 shows a battery gauge displayed on the monitor screen of a portable computer. The battery gauge is displayed by a window W13 including its title bar W11 and information on the present battery level and the remaining battery capacity. The remaining battery capacity is denoted by a percentage and also denoted by a bar graph W12 via software.

Figure 5:
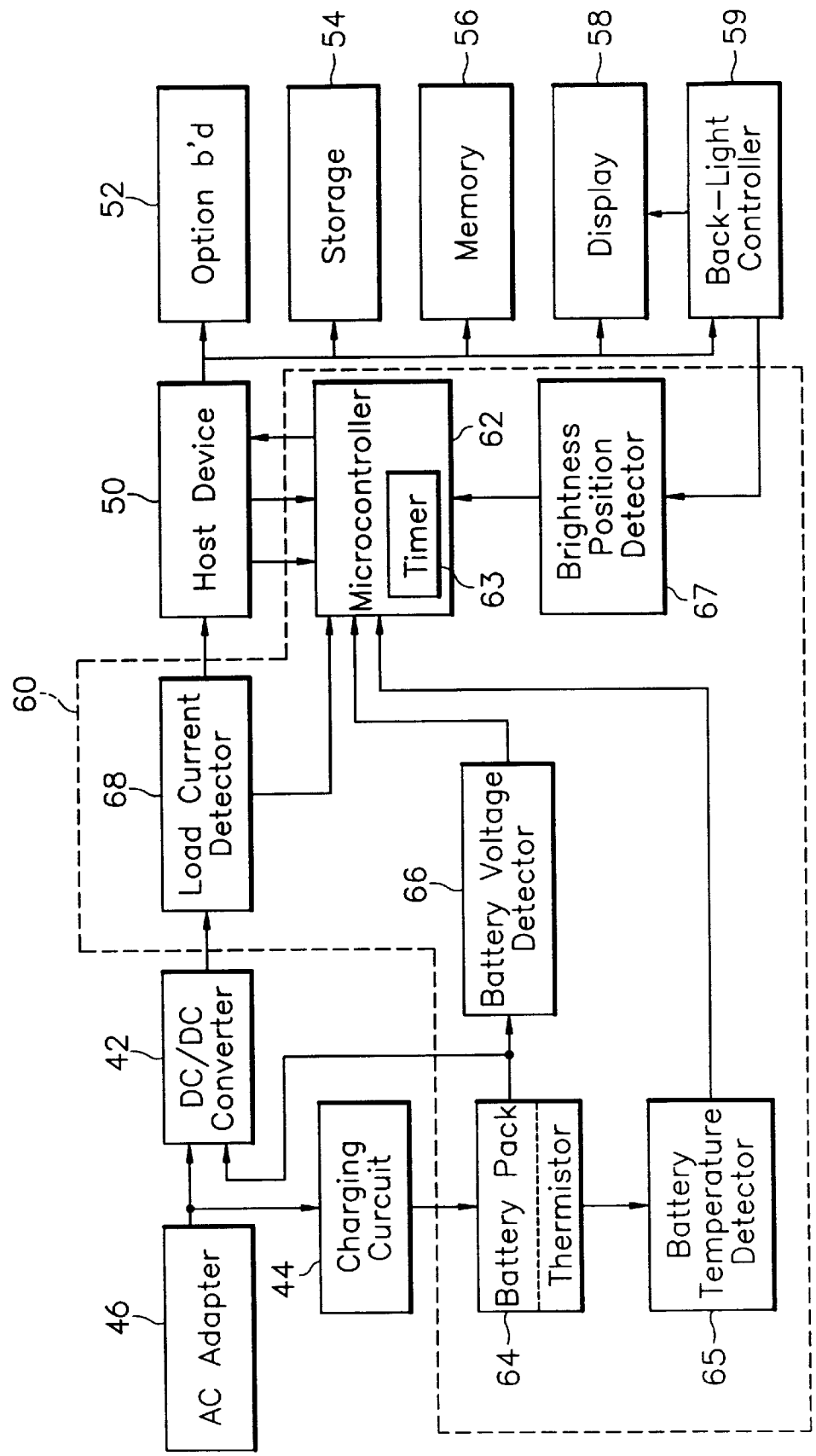
FIG. 5 is a block diagram depicting a battery monitoring system in accordance with the present invention.

Referring to FIG. 5, there is shown a battery monitoring system in accordance with the present invention. The battery monitoring system 60 includes a microcontroller 62, a battery pack 64, a battery temperature detection circuit 65, a battery voltage detection circuit 66, a brightness position detection circuit 67, and a load current detection circuit 68. The microcontroller 62 is coupled to a host device 50 such as a notebook computer. The host device 50 includes a controller, such as a computer main board, an optional board 52, a storage device 54, a memory 56, an LCD display 58, and an LCD back-light controller 59. The host device 50 further includes a DC/DC converter 42 and a battery charging circuit 44. An AC adapter 46 is connected to the DC/DC converter 42 and the battery charging circuit 44. The charging circuit 44 is coupled to the battery pack 64.

The host device 50 is usually powered by the battery pack 64 and alternatively by the AC adapter 46 which can be connected to an AC outlet. The DC output of the AC adapter 46 is supplied to the charging circuit 44 and the DC/DC converter 42 so that the charger 44 may charge the battery pack 64 whenever the device is powered by AC power. Also, when the AC power is not used, the DC power of the battery pack 64 is supplied to the input of the DC/DC converter 42. The DC/DC converter 42 produces appropriate operating voltages required by the host device.

The battery pack 64 usually includes a plurality of battery cells such as Ni—MH battery cells, and a thermistor is provided inside the pack for sensing the temperature of the battery surface during the charging or discharging operation of the battery. The battery pack 64 has a temperature sensing terminal connected to the input of the battery temperature detection circuit 65. The battery temperature detection circuit 65 detects the resistive value of the thermistor and inputs it to the microcontroller 62. Also, the battery voltage detection circuit 66 detects battery terminal voltage and supplies it to another input of the microcontroller 62. Further, the load current detection circuit 68 senses a load current at the power input of the host device 50 and supplies it to another input of the microcontroller 62. A timer 63 provided in the microcontroller 62 starts to a count time when the battery recharge reaches its full charge state.

Furthermore, the brightness position detection circuit 67 senses a brightness value of the LCD back-light controller 59 and send it to another input of the microcontroller 62. The host device 50 checks the system power management setup condition stored in a BIOS ROM, basic input/out system (BIOS) read only memory (ROM), of the computer system as well as the display power management setup condition in the display portion of a common operating system in order to provide these conditions to the microcontroller 62. The microcontroller 62 has the function of monitoring the performance of the battery, as well as the power consumption of the host device in accordance with the invention; and it produces accurate battery residual capacity data along, with a predicted remaining operating time of the host device, in consideration of variations of the battery temperature, the amount of battery self-discharge, the amount of battery discharge from the host device, the brightness level of the liquid crystal display (LCD) back-light device, a power saving level set in the host device, and a display power saving level set in a common operating system.

Figure 6:
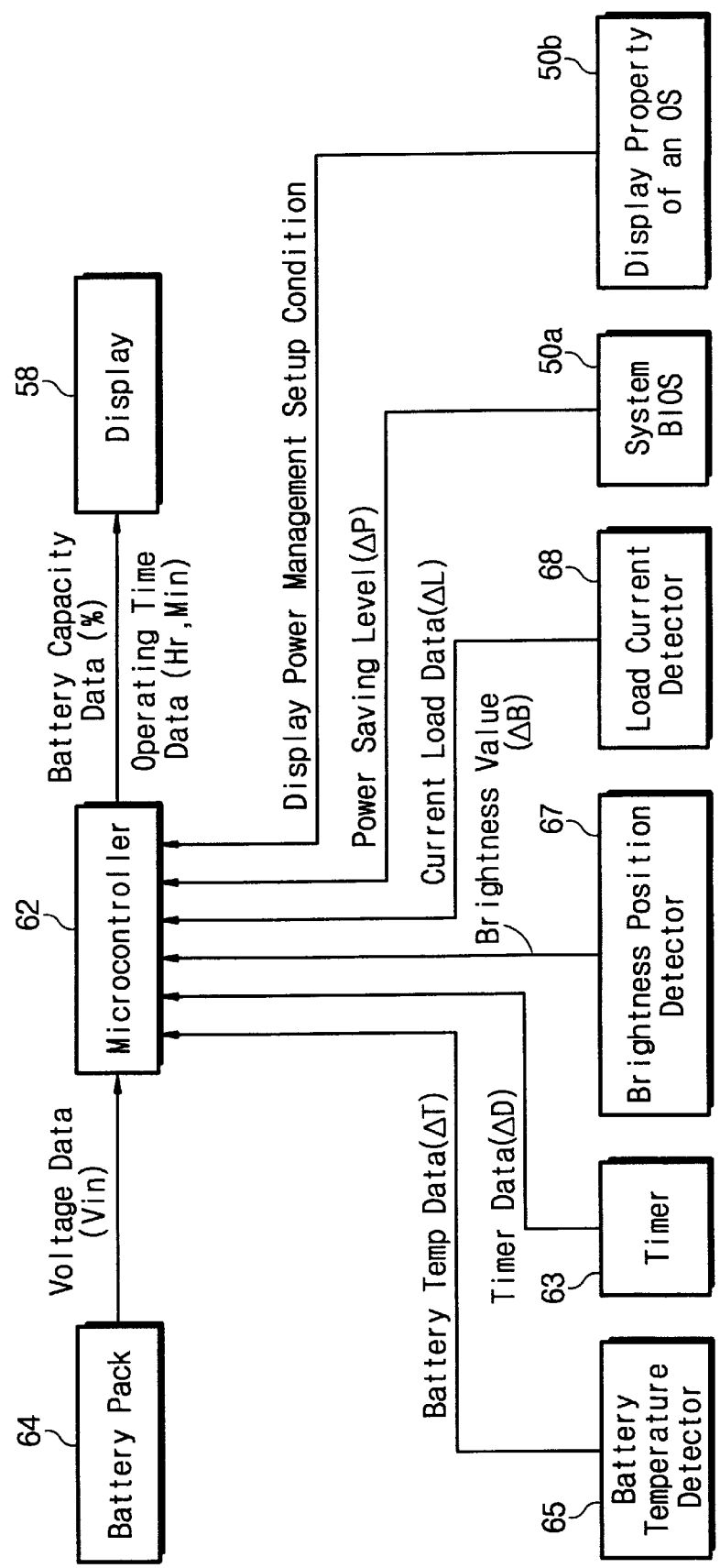
FIG. 6 is a diagram for depicting a learning method adopted in the battery monitoring system of FIG. 5, for determining residual capacity of a battery in accordance with the present invention.
Figure 7:
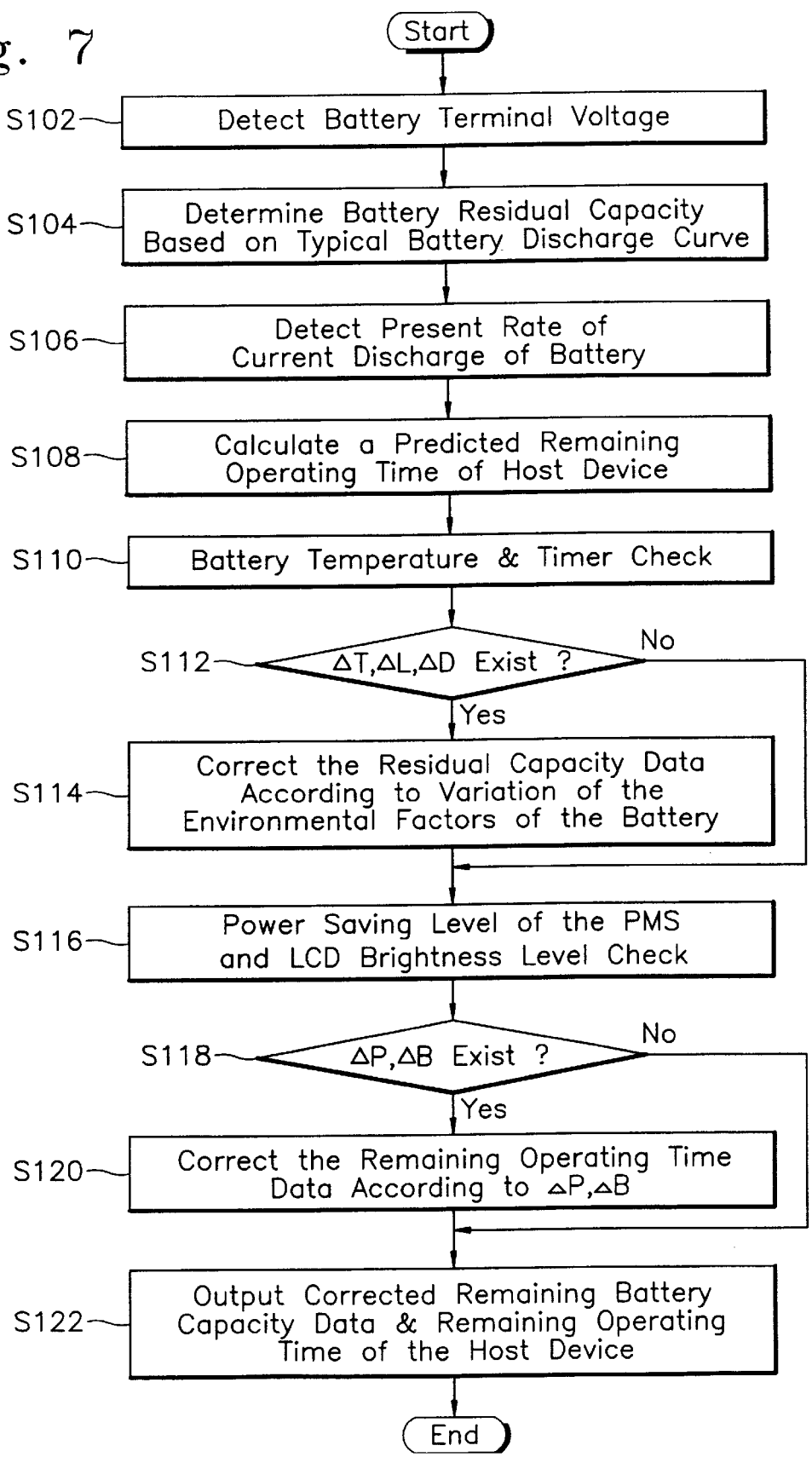
FIG. 7 is a flowchart showing operation of the monitoring system of FIG. 5.

A method for determining residual capacity of a battery and remaining operating time of the host device, performed in the microcontroller 62, will be described with reference to FIG. 6 and FIG. 7. FIG. 6 illustrates a learning method of determining battery residual capacity and the remaining operating time adopted in the microcontroller 62, and FIG. 7 shows the operation of the monitoring system of FIG. 5. In FIG. 6, battery terminal voltage data Vin detected by the battery voltage detection circuit 66 is input to the microcontroller 62. In addition, battery temperature data $\Delta T$ from the battery temperature detection circuit 65, timer data $\Delta D$ from a timer 63 provided in the microcontroller 62 representing the amount of battery self-discharge, load current data $\Delta L$ from the load current detection circuit 68 representing the present rate of current discharge by the battery are also input to the microcontroller 62.

Furthermore, a brightness value $\Delta B$ from the brightness position detector 67, power a saving amount $\Delta P$ of the power management setup in the system BIOS 50a, and display power management setup data from the display portion or property of an operating system 50b are also input to the microcontroller 62.

The outputs of the microcontroller 62 are the calculated battery residual capacity data and a predicted remaining operating time of the host device 50.

Figure 8:
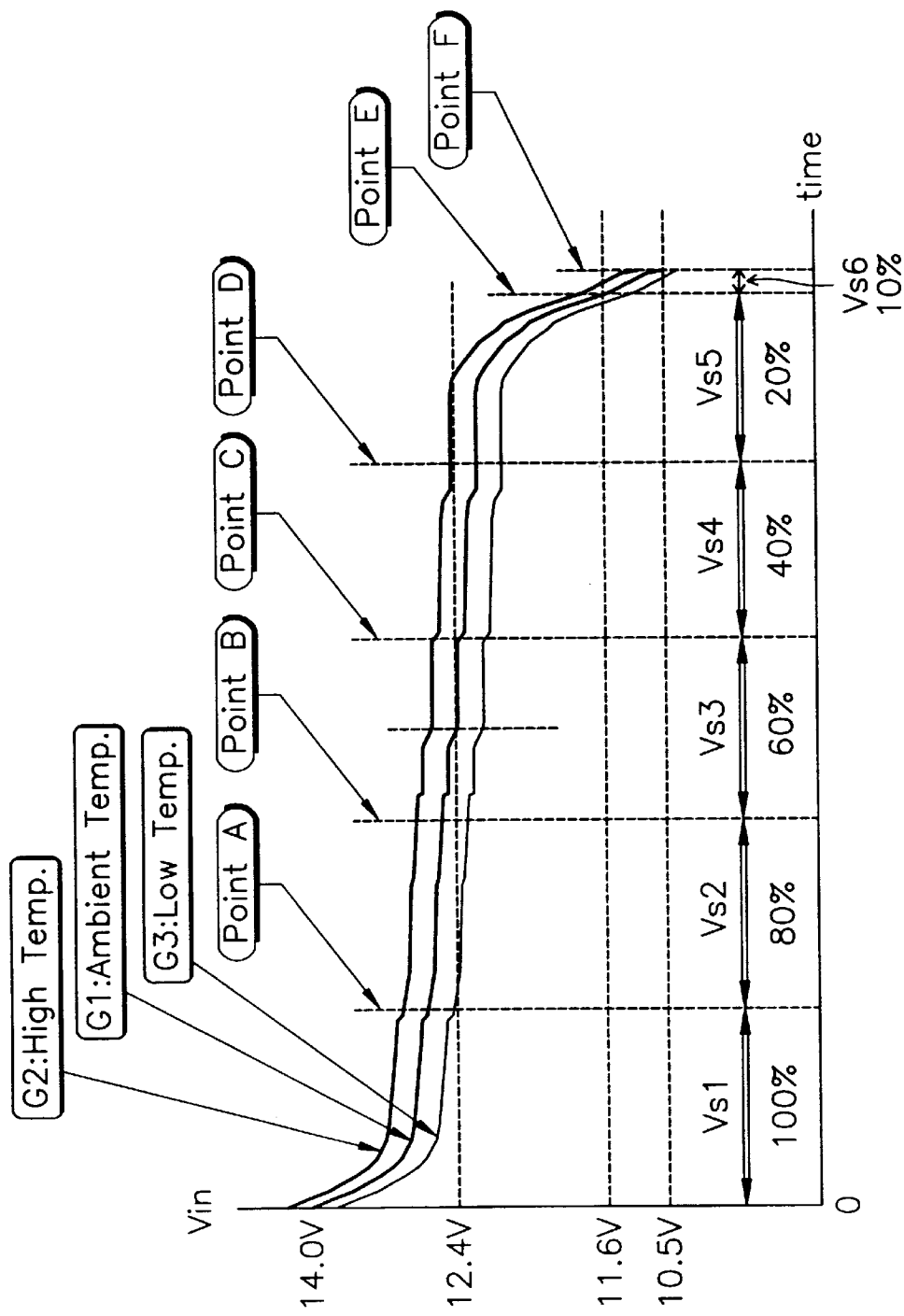
FIG. 8 is a graph showing discharge voltage curves plotted according to variation of battery temperatures.

The microcontroller 62 adds variations of battery temperature $\Delta T$, amount of battery self-discharge $\Delta D$, and amount of battery discharge $\Delta L$ onto the battery residual capacity data produced in the microcontroller 62, based on the battery discharge voltage curve (G1) of FIG. 8, that is plotted under the condition of ambient temperature (25 degrees centigrade), 30 minutes to one hour of self-discharge time, and the load current at about two hours of battery usage time.

The residual capacity data of the battery corresponding to the terminal voltage data Vin is corrected first according to variations of the battery temperature $\Delta T$. As can be seen in the battery discharge curves G2 and G3 shown in FIG. 8, the discharge voltage of the battery is increased at a higher temperature, and decreased at a lower temperature as compared to that of the ambient temperature. For example, at ambient temperature, the detected battery voltage of 12.4 Volts corresponds to 50% of the battery capacity according to graph G1. However, at the higher temperature, the same battery voltage may represent 20% of the battery capacity according to the discharge curve G2. Also, at the lower temperature, the same battery voltage may represent 80% of the battery capacity according to the discharge curve G3. Thus, the microcontroller 62 senses the variation of the temperature $\Delta T$, and converts it into a value to correct input terminal voltage data such that the value is added to or subtracted from the input terminal voltage. Further correction may be performed by considering the following factors: arithmetic data for the difference of the battery chemistry, vendor, and type.

Figure 9:
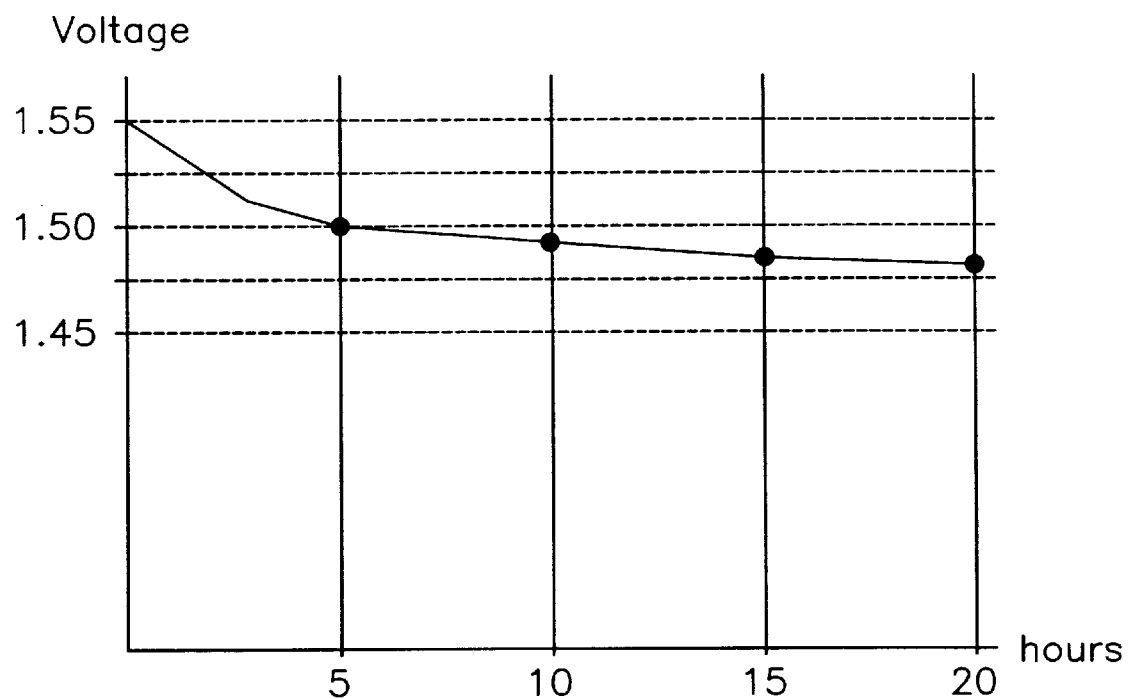
FIG. 9 is a graph showing variation of battery voltage according to self-discharge of a battery.

Secondly, the residual capacity data Vs of the battery corresponding to the terminal voltage data Vin is corrected according to variation of self-discharge over time. As can be seen in the battery discharge voltage curve shown in FIG. 9, the battery voltage is decreased by a small amount from the full charge state when the battery is not used. The microcontroller 62 checks timer data $\Delta D$ from the timer 63 to calculate self-discharge time counted from the charge end point of the battery. The self-discharge time is converted into a value to correct input terminal voltage data such that the value is added to the input terminal voltage.

Figure 10:
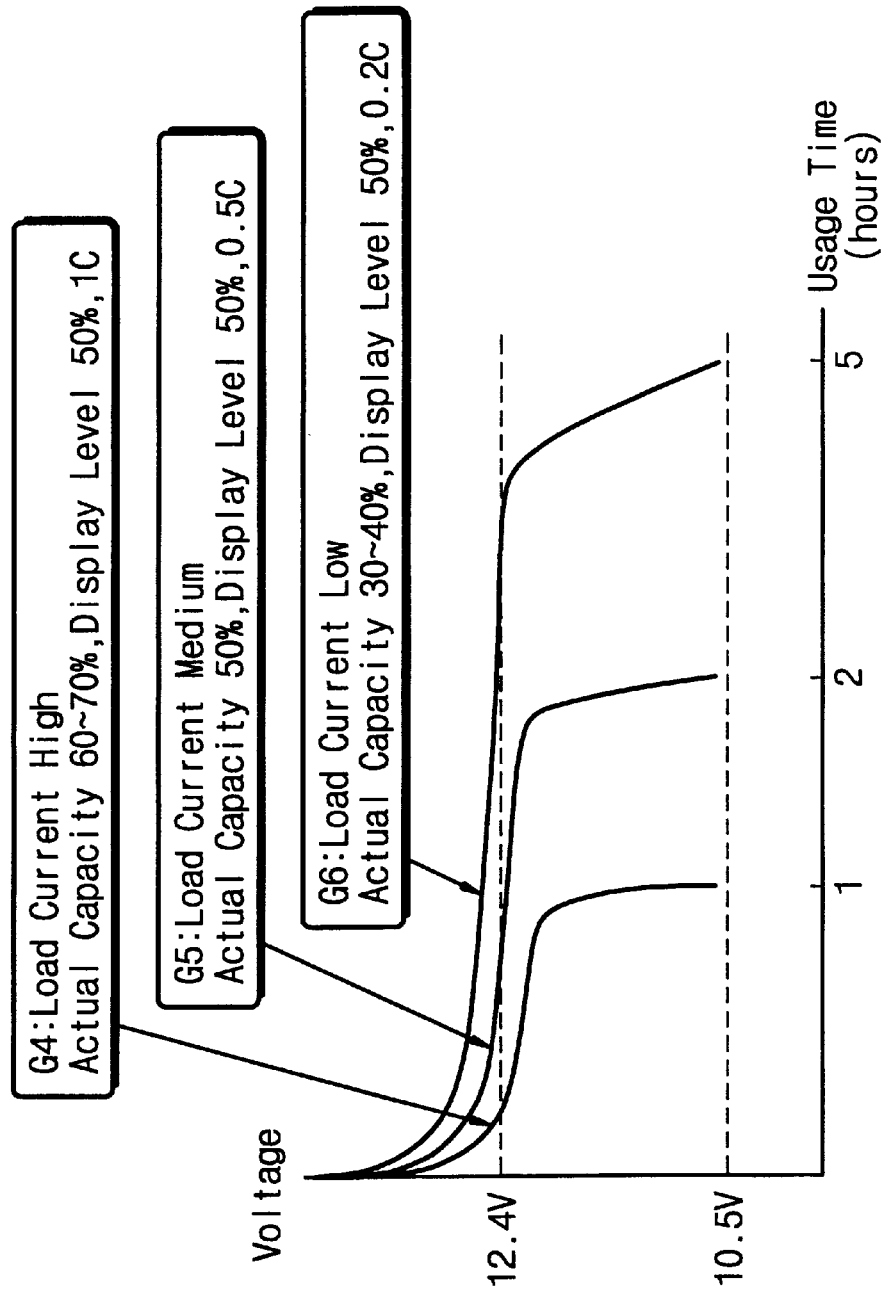
FIG. 10 is a graph showing discharge voltage curves plotted according to variation of battery load current.

Lastly, the residual capacity data Vs of the battery corresponding to the terminal voltage data Vin is corrected according to variation of load current data $\Delta L$ caused by current drawn by the system host. As can be seen in the discharge voltage curves G4, G5, and G6 shown in FIG. 10, the battery voltage varies with the load current discharged from the host device. Discharge curve G4 was plotted at high load current state. The battery voltage is decreased at full access of the host device. With this curve G4, 50% of the battery residual capacity data may be obtained, for example, despite actual remaining battery capacity is 60% to 70%. At normal load current, the discharge voltage curve G5 is plotted, by which 50% of the battery residual capacity data may correspond to actual remaining capacity of the battery. In the case of low load current, when the power management operation is performed in the host device, the discharge voltage curve G6 is plotted, by which 50% of the battery residual capacity data may be obtained despite actual remaining battery capacity is 30% to 40%. The correction is made such that variation of load current data $\Delta L$ is converted into a factor being applied to the obtained battery residual capacity data; and in case of high load current, basically the factor is designated by 1C. For normal and low load currents the designated factors are 0.5C and 0.2C, respectively.

Further, the microcontroller 62 calculates a predicted remaining operating time of the host device 50, on the basis of the present rate of current discharge of the battery detected by the load current detector 68 and the terminal voltage of the battery. Thus, the calculated power consumption rate is corrected such that variation of the power saving level $\Delta P$ is converted into a factor and is added to the present power consumption rate. If the power saving level of the Power Management System (PMS) is set to one of low/medium/high level, the corresponding set up condition will reduce the power consumption rate when each power management timer is operated. In this case, the correction factor may be set below one (1) provided that the power saving OFF condition is converted into a factor having a value of one. Also, a variation of the brightness control value $\Delta B$ detected from the brightness position detector 67 is converted into a factor and is applied to the present power consumption rate. If the brightness position value is decreased below the preset value, the correction factor will be set below one, which reduces the present power consumption rate. Similarly, a variation of the display power management setup condition results in correction of the present power consumption rate since the set up condition will reduce or cut off the power supplied to the display device when the corresponding timer is operated.

In brief, the operation of the battery monitoring system will be described with reference to FIG. 7. The microcontroller 62 detects the terminal voltage of a dumb Ni—MH battery when it is requested by a user at step S102. With this, the microcontroller 62 converts the detected terminal voltage into residual capacity data at step S104, based on the typical battery discharge curve as shown in FIG. 3. Then, the microcontroller 62 detects the load current to calculate the present power consumption rate of the host device at step S106. Further calculation is effected at step S108 to obtain a predicted remaining operating time of the host device based on the information on the present power consumption rate.

Next, the battery temperature and the timer data are detected at step S110 for determining the variation of the temperature ΔT compared to ambient temperature and for determining the amount of the battery self-discharge ΔD.

A determination is made at step S112 as to whether or not variations ΔT, ΔL, and ΔD exist. If at least one of the variations ΔT, ΔL, and ΔD exist, the microcontroller 62 corrects the battery residual capacity data according to the value of the environmental factors of the battery at step S114. Further, the power saving level of the PMS and the LCD back-light brightness level is checked at step S116 to determine whether or not variations ΔP and ΔB exist at step S118.

If at least one of the variations ΔP and ΔB exist, the microcontroller 62 corrects the remaining operating time data obtained in step S108 according to the values of the power saving related factors of the host device 50 at step S120.

Figure 11:
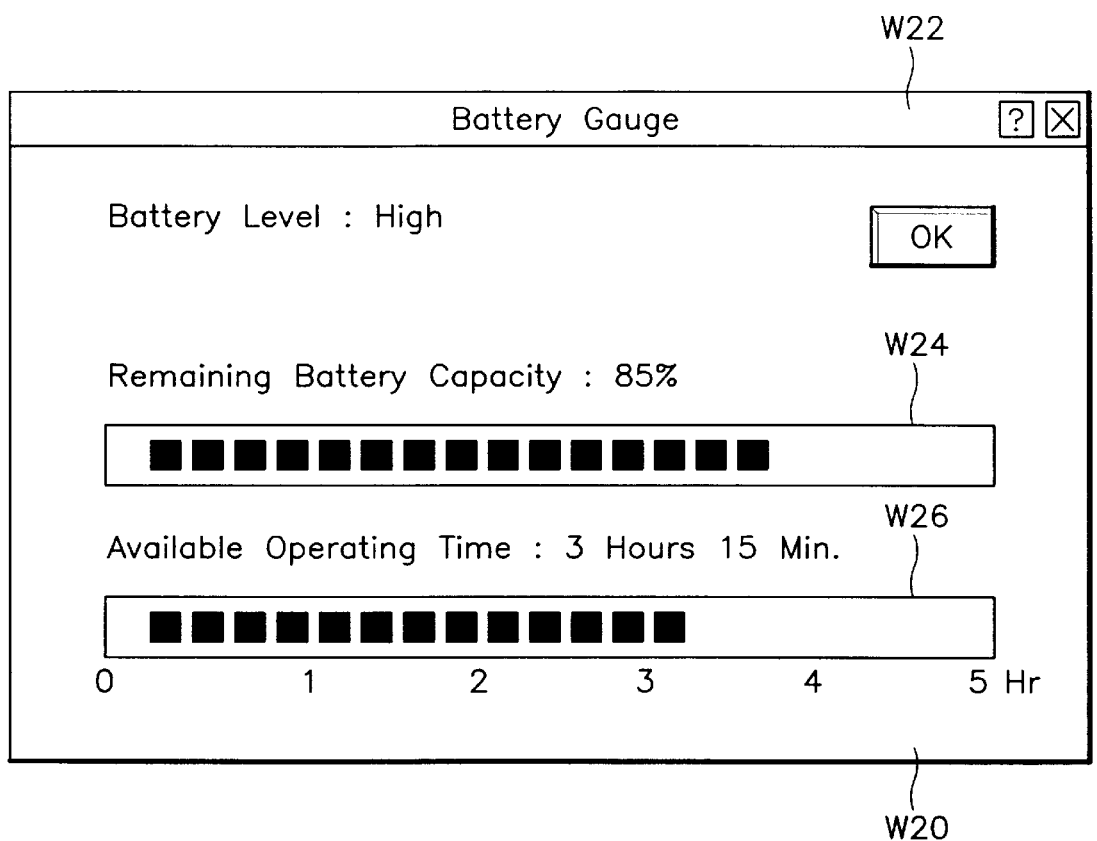
FIG. 11 is a diagram showing a battery gauge displayed on a monitor screen in accordance with the present invention.

Lastly, the resultant battery capacity data, as well as the remaining operating time data, are supplied to the host device 50 so as to display the battery residual capacity and the remaining operating time at step S122. One example of a battery gauge that displays the above battery residual capacity and the remaining operating time in the monitor screen of a portable computer is shown in FIG. 11. There, the battery gauge is displayed by a window W20 including its title bar W22 and inside thereof the information about the present battery level, remaining battery capacity, and available operating time of the device. Via a software program, the remaining battery capacity is denoted by a percentage and by a bar graph W24. Also, the available operating time is denoted by hours and minutes and by a bar graph W26, which provides the user with accurate and easy recognition of the remaining battery capacity and available operating time.

As apparent from the foregoing description, the battery monitoring system of the present invention provides accurate residual capacity data of a dumb battery corresponding to the battery terminal voltage by considering variations of battery temperature, amount of battery self-discharge, and amount of battery discharge from the host device. Further, this invention provides for an accurate indication of the remaining operating time of the device with a simple arrangement. Therefore, a cost-effective and a more predictive battery monitoring system can be provided in a battery powered electronic device using a dumb Ni—MH battery.

It should be understood that the present invention is not limited to the particular embodiment disclosed herein as the best mode contemplated for carrying out the present invention, but rather that the present invention is not limited to the specific embodiment described in this specification except as defined in the appended claims.

What is claimed is:

1. An apparatus for measuring a residual capacity of a dumb battery used in a portable electronic device having a display device, comprising:

a voltage detector for detecting a terminal voltage of the dumb battery and for producing a terminal voltage signal corresponding to the detected terminal voltage of the dumb battery;

a temperature sensor for sensing a battery temperature of the dumb battery and for producing a battery temperature signal corresponding to the sensed battery temperature of the dumb battery;

a current sensor for sensing a load current of the dumb battery and for producing a load current signal corresponding to the sensed load current of the dumb battery;

a power saving level detector for detecting a power saving level set in the portable electronic device having the display device; and a controller for determining the residual capacity of the dumb battery based on the detected terminal voltage of the dumb battery and for determining a predicted remaining operating time of the portable electronic device based on the sensed load current, and the controller for correcting the determined residual capacity of the dumb battery according to the battery temperature signal and the load current signal, and the controller for correcting the predicted remaining operating time of the portable electronic device according to the power saving level set in the portable electronic device, the resultant residual capacity of the dumb battery and the resultant predicted remaining operating time of the portable electronic device being input to the portable electronic device so as to display on the display device the resultant residual capacity of the dumb battery and the resultant remaining operating time of the portable electronic device.

2. The apparatus of claim 1, further comprising:

a battery charger for charging the dumb battery;

a timer for measuring a time duration from a charge end point to a discharge start point of the dumb battery and for producing a timer signal corresponding to the measured time duration; and a back-light brightness position detector for detecting a brightness level corresponding to a power consumption level in a back-light of the display device, the display device comprising a liquid crystal display (LCD), the controller further performing a correction of the resultant residual capacity of the dumb battery according to the timer signal and the controller further performing a correction of the resultant predicted remaining operating time of the portable electronic device according to a variation of the brightness level of the back-light of the display device.

3. The apparatus of claim 1, further comprised of the controller determining the power saving level of the portable electronic device from power management setup data stored in a basic input/out system (BIOS) of the portable electronic device and display power management setup data of a display portion of an operating system of the portable electronic device.

4. The apparatus of claim 1, further comprised of the dumb battery comprising an enclosed rechargeable battery, including a plurality of battery cells and a thermistor for sensing a surface temperature of the plurality of battery cells.

5. A method for measuring a residual capacity of a dumb battery used in a host device, comprising the steps of:

detecting a terminal voltage of the dumb battery;

determining a remaining battery capacity of the dumb battery from the detected terminal voltage of the dumb battery;

detecting at least one environmental factor causing inaccuracy of the determined remaining battery capacity of the dumb battery;

determining whether a correction is required of the determined remaining battery capacity of the dumb battery according to the detected at least one environmental factor;

correcting the determined remaining battery capacity of the dumb battery based on the at least one environmental factor, when a correction is required of the determined remaining battery capacity of the dumb battery; and producing a resultant remaining battery capacity for the dumb battery for display by th e host device.

6. The method of claim 5, further comprised of the at least one environmental factor comprising: at least one of a variation of battery temperature of the dumb battery, an amount of battery self-discharge of the dumb battery, and an amount of battery discharge of the dumb battery from the host device.

7. The method of claim 5, further comprised of the determined remaining battery capacity correction step comprising the steps of:

detecting a battery temperature of the dumb battery subtracting a value corresponding to a variation of the battery temperature of the dumb battery from the determined remaining battery capacity of the dumb battery upon the battery temperature of the dumb battery being higher than a predetermined ambient temperature; and s adding a value corresponding to the variation of the battery temperature of the dumb battery to the determined remaining battery capacity of the dumb battery upon the battery temperature of the dumb battery being lower than the predetermined ambient temperature.

8. The method of claim 5, further comprised of the determined remaining battery capacity correction step comprising the steps of:

detecting a load current of the dumb battery;

adding a value corresponding to a variation of the load current of the dumb battery to the determined remaining battery capacity of the dumb battery upon the detected load current of the dumb battery being higher than a predetermined load current; and subtracting a value corresponding to the variation of the load current of the dumb battery from the determined remaining battery capacity of the dumb battery upon the detected load current of the dumb battery being lower than the predetermined load current.

9. The method of claim 5, further comprised of the determined remaining battery capacity correction step comprising the steps of:

measuring by a timer a timer output corresponding to a self discharge time of the dumb battery;

adding a value corresponding to a timer output signal for the timer output to the determined remaining battery capacity of the dumb battery upon the timer output being larger than a predetermined amount; and subtracting a value corresponding to the timer output signal for the timer output from the determined remaining battery capacity of the dumb battery upon the timer output being smaller than the predetermined amount.

10. A method for indicating a remaining operating time of a battery powered host device using a dumb battery, comprising the steps of:

detecting a terminal voltage of the dumb battery;

detecting a current value discharged by the dumb battery;

determining a remaining operating time of the host device based on the detected terminal voltage of the dumb battery and the detected current value of the dumb battery;

detecting at least one power saving related factor set in the host device;

determining whether a correction is required of the determined remaining operating time of the host device according to the detected at least one power saving related factor;

correcting the determined remaining operating time of the host device based on the at least one power saving related factor, when a correction is required of the determined remaining operating time of the host device; and producing a resultant remaining operating time of the host device for display by a display of the host device.

11. The method of claim 10, further comprised of the at least one power saving related factor comprising: at least one of a variation of a power saving level set in a power management system of a basic input/output system read only memory (BIOS ROM) of the host device and a variation of a display power saving level set in a display portion of an operating system of the host device.

12. The method of claim 11, further comprised of the determined remaining operating time correction step comprising the step of:

subtracting a value corresponding to the variation of the power saving level set in the power management system of the basic input/output system read only memory (BIOS ROM) of the host device from a present power consumption rate of the host device upon the power saving level being increased to a high level.

13. The method of claim 11, further comprised of the determined remaining operating time correction step comprising the step of:

subtracting a value corresponding to the variation of the display power saving level set in the display portion of the operating system of the host device from a present power consumption rate of the host device upon the display power saving level being increased to a high level.

14. The method of claim 10, further comprised of the determined remaining operating time correction step comprising the steps of:

adding a value corresponding to a variation of a brightness value of a liquid crystal display (LCD) back-light of a display of the host device to a present power consumption rate of the host device upon the brightness value being higher than a predetermined level; and subtracting a value corresponding to the variation of the brightness value of the liquid crystal display (LCD) back-light of the display of the host device from the present power consumption rate of the host device upon the brightness value being lower than the predetermined level.

15. The apparatus of claim 1, further comprised of said dumb battery comprising one of a rechargeable nickel cadmium battery, a rechargeable nickel metal hydride battery and a rechargeable lithium ion battery.

16. The method of claim 5, further comprised of the dumb battery comprising an enclosed rechargeable battery, including a plurality of battery cells and a thermistor for sensing a surface temperature of the plurality of battery cells.

17. The method of claim 10, further comprised of the dumb battery comprising an enclosed rechargeable battery, including a plurality of battery cells and a thermistor for sensing a surface temperature of the plurality of battery cells.

18. The method of claim 5, further comprised the determined remaining battery capacity correction step comprising the steps of:

detecting a battery temperature of the dumb battery;

subtracting a value corresponding to a variation of the battery temperature of the dumb battery from the determined remaining battery capacity of the dumb battery upon the battery temperature of the dumb battery being higher than a predetermined ambient temperature;

adding a value corresponding to the variation of the battery temperature of the dumb battery to the determined remaining battery capacity of the dumb battery upon the battery temperature of the dumb battery being lower than the predetermined ambient temperature;

detecting a load current of the dumb battery;

adding a value corresponding to a variation of the load current of the dumb battery to the determined remaining battery capacity of the dumb battery upon the detected load current of the dumb battery being higher than a predetermined load current;

subtracting a value corresponding to the variation of the load current of the dumb battery from the determined remaining battery capacity of the dumb battery upon the detected load current of the dumb battery being lower than the predetermined load current;

measuring by a timer a timer output corresponding to a self discharge time of the dumb battery;

adding a value corresponding to a timer output signal for the timer output to the determined remaining battery capacity of the dumb battery upon the timer output being larger than a predetermined amount; and subtracting a value corresponding to the timer output signal for the timer output from the determined remaining battery capacity of the dumb battery upon the timer output being smaller than the predetermined amount.

19. The method of claim 11, further comprised of the determined remaining operating time correction step comprising the steps of:

subtracting a value corresponding to the variation of the power saving level set in the power management system of the basic input/output system read only memory (BIOS ROM) of the host device from a present power consumption rate of the host device upon the power saving level being increased to a high level; and subtracting a value corresponding to the variation of the display power saving level set in the display portion of the operating system of the host device from the present power consumption rate of the host device upon the display power saving level being increased to a high level.

20. The method of claim 19, further comprised of the determined remaining operating time correction step comprising the steps of:

adding a value corresponding to a variation of a brightness value of a liquid crystal display (LCD) back-light of a display of the host device to the present power consumption rate of the host device upon the brightness value being higher than a predetermined level; and subtracting a value corresponding to the variation of the brightness value of the liquid crystal display (LCD) back-light of the display of the host device from the present power consumption rate of the host device upon the brightness value being lower than the predetermined level.

* * * * *